(12) United States Patent
Lee

(10) Patent No.: US 6,456,493 B1
(45) Date of Patent: Sep. 24, 2002

(54) HEAT SINK CLIP

(75) Inventor: Hsieh Kun Lee, Chung-Ho (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/707,336

(22) Filed: Nov. 6, 2000

(30) Foreign Application Priority Data

Sep. 5, 2000 (TW) ...................................... 89215396 U

(51) Int. Cl.[7] .................................................. H05K 7/20
(52) U.S. Cl. ...................... 361/704; 361/709; 361/710; 257/718; 257/719; 257/727; 174/16.3; 165/80.3; 24/458
(58) Field of Search ................................ 361/704, 707, 361/709, 710, 717, 719, 722; 257/706, 707, 718, 719, 727; 174/16.3; 165/80.3, 185; 24/295, 457, 458, 495, 505; 248/316.7, 505, 510

(56) References Cited

U.S. PATENT DOCUMENTS 5,617,292 A * 4/1997 Steiner ........................ 361/704
5,671,118 A * 9/1997 Blomquist ................... 361/704
5,933,326 A * 8/1999 Lee et al. .................... 361/704
5,953,212 A * 9/1999 Lee ............................. 361/709

* cited by examiner

Primary Examiner—Boris Chervinsky
(74) Attorney, Agent, or Firm—Wei Te Chung

(57) ABSTRACT

A heat sink clip (10) includes a body (14) and a fastener (17). The body includes a central pressing portion (142), and first and second spring portions (144, 154) extending from opposite ends of the pressing portion. A connecting section (156) extends outwardly and upwardly from an end of the second spring portion, and then outwardly and downwardly. The uppermost portion of the connecting section forms a ridge (168). A longitudinal slot (162) is defined in the second spring portion and the connecting section, to provide elastic deformability. The end of the connecting section forms a pair of barbs (158). The fastener has a vertical arm (170), and an operation portion (177) extending away from the arm. The arm defines an opening (175) for engaging with the connecting section of the body, thereby attaching the fastener to the body.

18 Claims, 5 Drawing Sheets

HEAT SINK CLIP

BACKGROUND

1. Field of the Invention

The present invention relates to a clip, and particularly to a clip for attaching a heat sink to an electronic device.

2. The Related Art

Many electronic devices, such as Central Processing Units (CPUs), generate large amounts of heat during operation. This deteriorates their operational stability. To overcome this problem, a heat sink is often mounted to a CPU for removing heat therefrom. Various means have been used for attaching a heat sink to a CPU.

Taiwan Patents Nos. 309128 and 270563, and U.S. Pat. No. 5,486,981 disclose various clips for attaching heat sinks to CPUs. In Taiwan Patent No. 309128, a conventional heat sink clip comprises a spring body and a leg forming a plurality of protrusions to engage with one end of the spring body. However, considerable force is required when assembling the clip, and the assembly process takes an unduly long time. Furthermore, the clip cannot exert a large spring force on the heat sink.

Another prior art structure, described in Taiwan Patent No. 270563, comprises a clip having a spring portion and a handle pivotally connected to the spring portion and a leg. However, two pins are required to assemble these components together, which is unduly complicated and cumbersome.

Still another prior art structure shown in U.S. Pat. No. 5,486,981 comprises a clip having a pair of legs with latching ports respectively defined therein. Using the clip does not require tools. However, a user requires both hands simultaneously during parts of the installation procedure. This is inconvenient and unduly inefficient.

Thus a new heat sink clip is desired to overcome the above-mentioned problems of the prior art.

SUMMARY OF THE INVENTION

Accordingly, an object of the present invention is to provide a clip for readily attaching and detaching a heat sink and an electronic device.

Another object of the present invention is to provide a clip for securely attaching a heat sink to an electronic device.

To achieve the above-mentioned objects, a heat sink clip comprises a body and a fastener. The body comprises a pressing portion, and first and second spring portions extending from respective opposite ends of the pressing portion. A connecting section extends outwardly and upwardly from a free end of the second spring portion, and then outwardly and downwardly. The uppermost portion of the connecting section forms a ridge. A longitudinal slot is defined in the second spring portion and the connecting section, to provide elastic deformability. The end of the connecting section forms a pair of barbs. The fastener has a vertical arm, and an operation portion extending away from the arm. The arm defines an opening for engaging with the connecting section of the body, thereby attaching the fastener to the body.

Other objects, advantages and novel features of the present invention will be drawn from the following detailed embodiment of the present invention with attached drawings, in which:

DESCRIPTION OF THE PREFERRED EMBODIMENT

Figure 1:
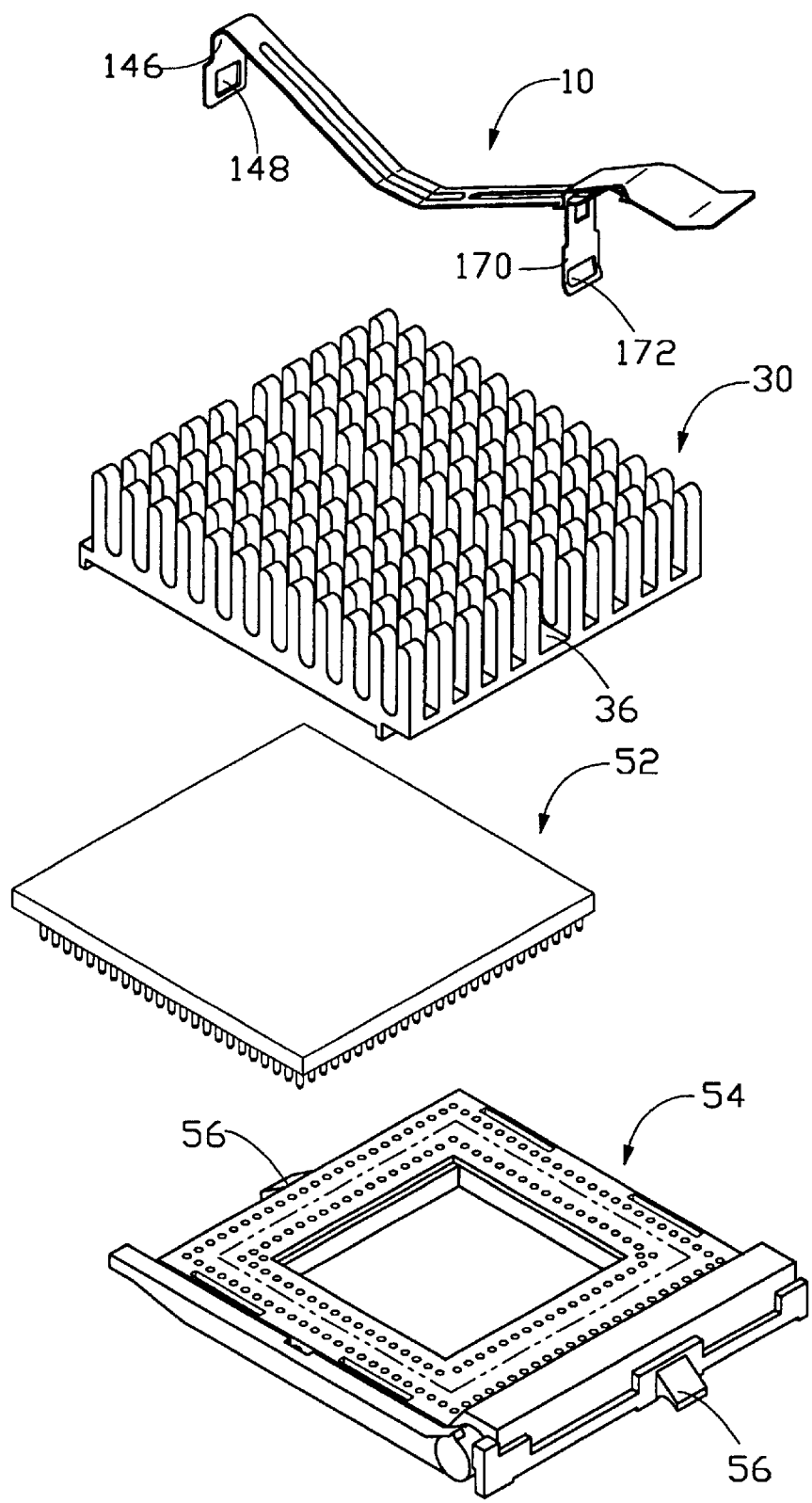
FIG. 1 is an exploded view showing a clip in accordance with the present invention, for attaching a heat sink to a CPU mountable on a socket connector.
Figure 2:
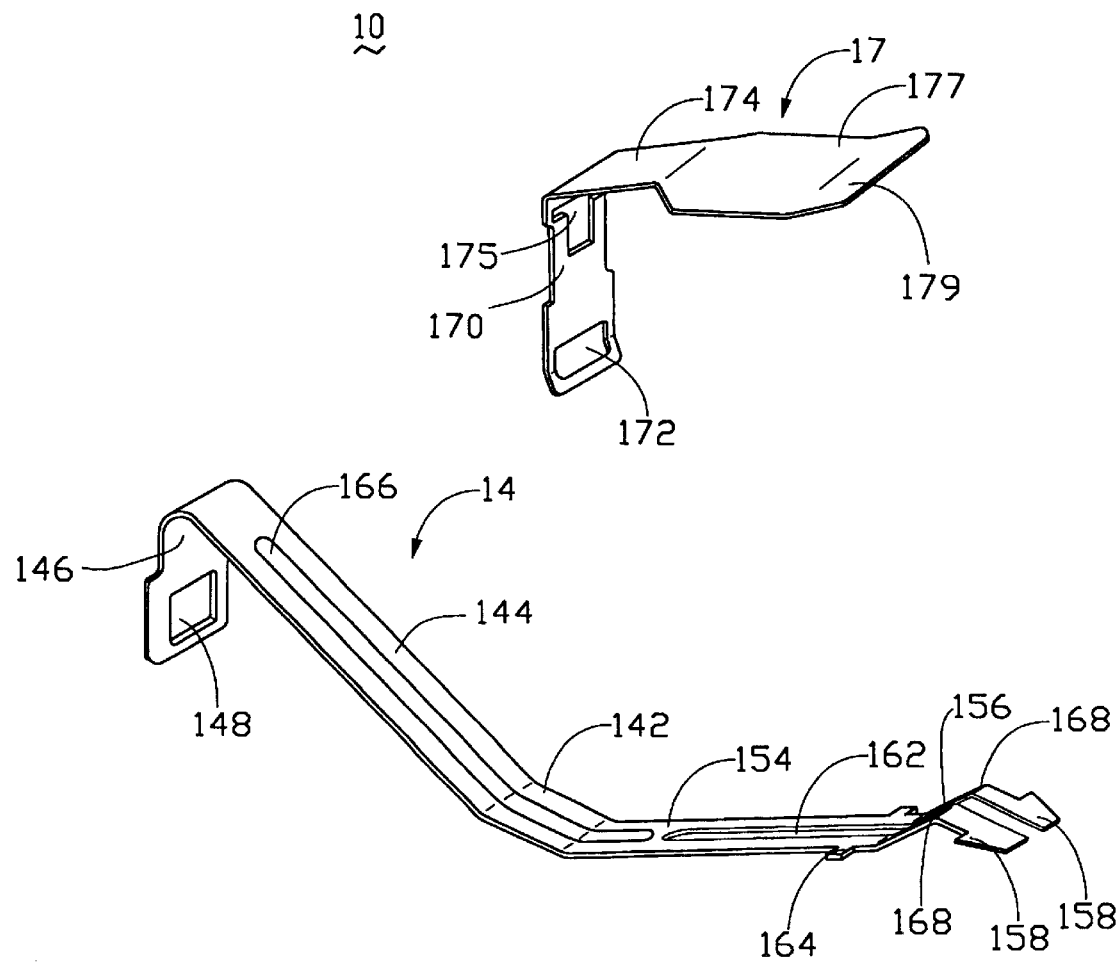
FIG. 2 is an exploded view of the clip of the present invention.

Referring to FIGS. 1 and 2, a clip 10 of the present invention attaches a heat sink 30 to a CPU 52 which is mounted on a socket connector 54. The heat sink 30, the CPU 52 and the socket connector 54 are all conventional. The heat sink 30 includes a slot 36 defined through a middle portion thereof, for receiving the clip 10. The socket connector 54 includes a pair of external tabs 56 formed on respective opposite sides thereof, for engaging with the clip 10.

The clip 10 includes a body 14 and a fastener 17. The body 14 includes a central pressing portion 142, and first and second spring portions 144, 154 extending from respective opposite ends of the pressing portion 142. A first leg 146 with a first aperture 148 defined therein depends from a free end of the first spring portion 144. A bifurcated connecting section 156 extends outwardly and upwardly from a free end of the second spring portion 154, and then further extends outwardly and downwardly. The uppermost portion of the connecting section 156 forms a ridge 168. A longitudinal reinforcing rib 166 is formed on the body 14, extending along the first spring portion 144, the pressing portion 142 and part of the second spring portion 154. The remaining part of the second spring portion 154 defines a longitudinal slot 162 which extends through the entire connecting section 156, to provide elastic deformability for the connecting section 156. The second spring portion 154 forms a pair of protrusions 164 on respective opposite lateral sides thereof, near the connecting section 156. A pair of barbs 158 extends from respective opposite lateral sides of an end portion of the connecting section 156.

The fastener 17 includes a vertical arm 170, and a connecting portion 174 extending from a top edge of the arm 170 at an angle slightly more than 90 degrees. The arm 170 defines a second aperture 172, and a T-shaped opening 175 above the second aperture 172. A widened operation portion 177 extends from a free end of the connecting portion 174 such that the operation portion 177 is disposed perpendicular to the arm 170. An extension portion 179 extends outwardly and upwardly from a free end of the operation portion 177.

Figure 3:
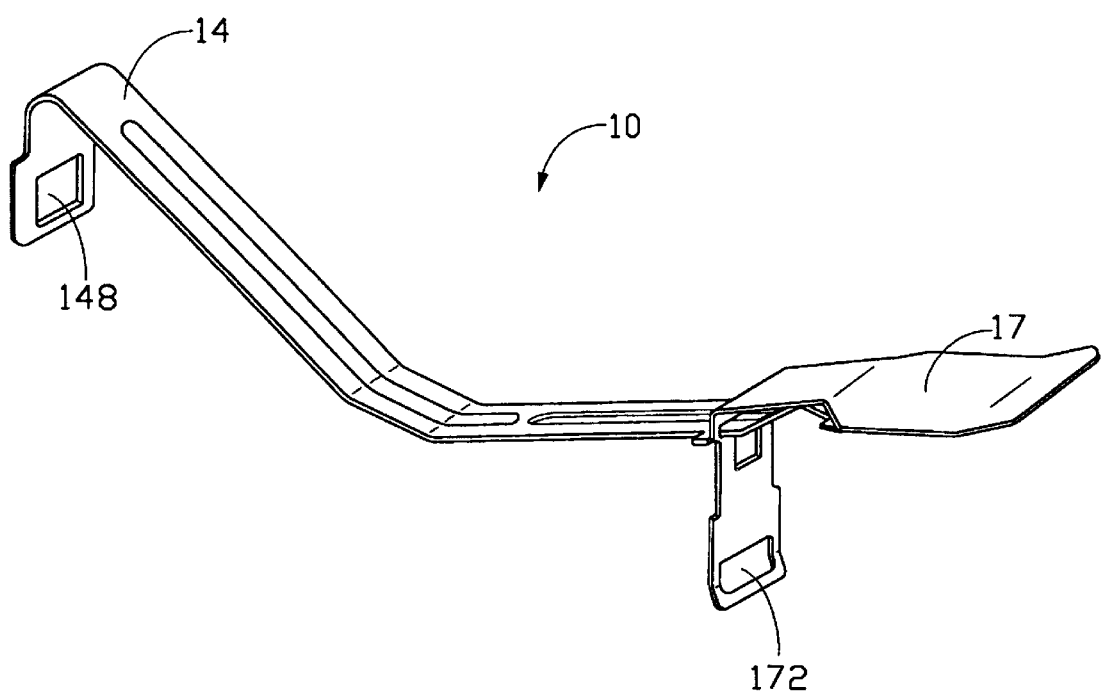
FIG. 3 is an assembled view of FIG. 2.
Figure 4:
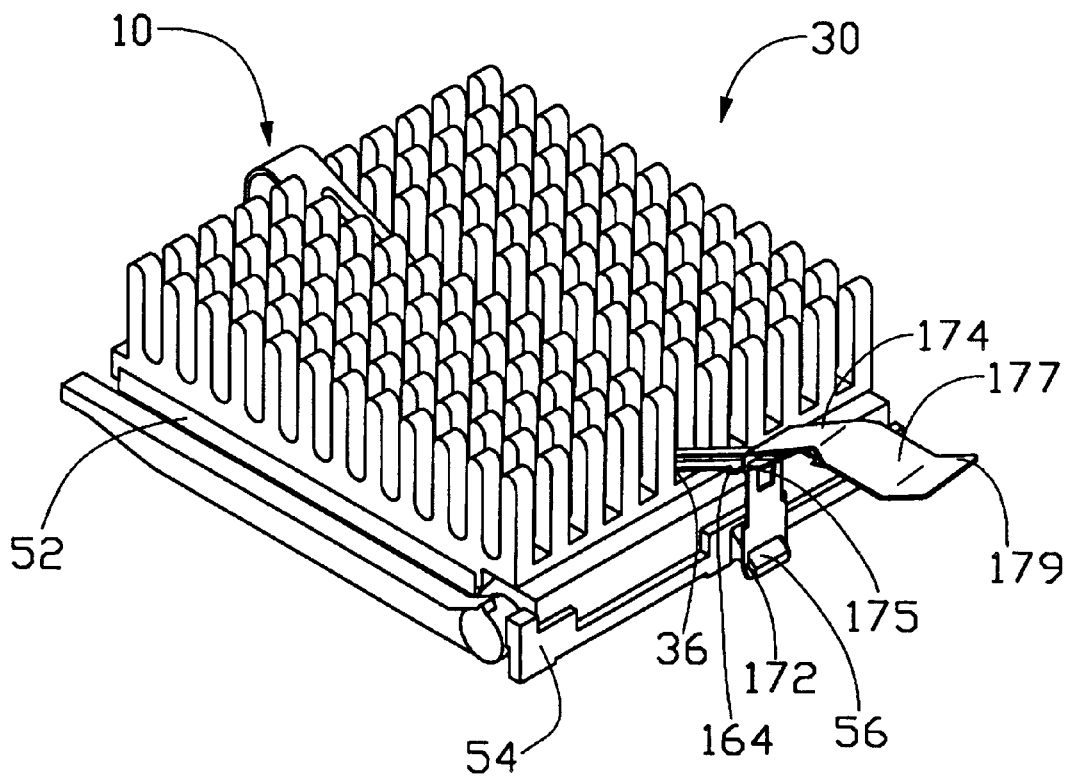
FIG. 4 is an assembled view of FIG. 1, with the clip of the present invention in an unlocked position.

Referring also to FIGS. 3 and 4, in assembly, the body 14 is pushed against the fastener 17. The barbs 158 of the body 14 are driven into a wide portion of the T-shaped opening 175 of the fastener 17. The connecting section 156 thereby elastically deforms to allow the barbs 158 to fully pass through the wide portion of the T-shaped opening 175 of the fastener 17. The body 14 is continued to be pushed until the protrusions 164 of the body 14 abut the arm 170 of the fastener 17. A pivotal connection is thereby formed between the body 14 and the fastener 17. The CPU 52 is mounted on the socket connector 54. The heat sink 30 is placed on the CPU 52. The clip 10 is placed in the slot 36 of the heat sink 30. The first and second apertures 148, 172 respectively engage with tabs 56 of the socket connector 54. At this stage, the clip is defined to be in an "unlocked" or loose position.

Figure 5:
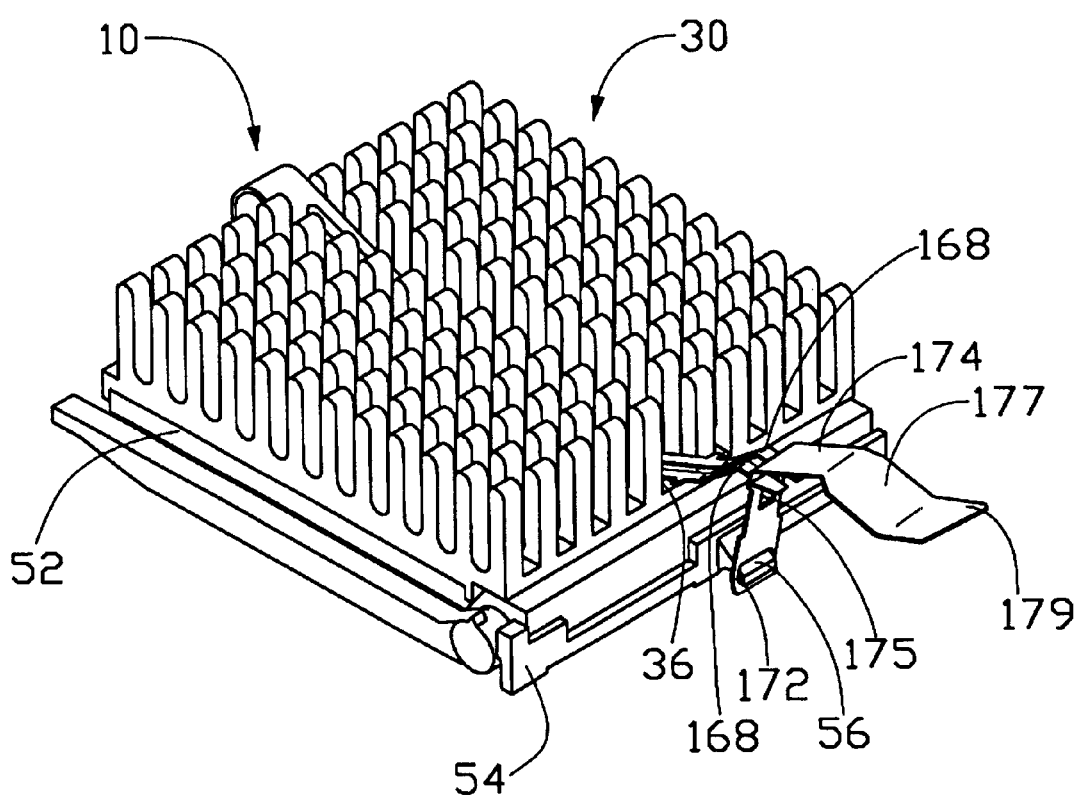
FIG. 5 is similar to FIG. 4, but showing the clip in a locked position.

Referring also to FIG. 5, the operation portion 177 is pulled outwardly. The T-shaped opening 175 slides along the connecting section 156 over the ridge 168 until it abuts the barbs 158. The first and second spring portions 144, 154 are thereby elastically deformed. The elastic energy of the first and second spring portions 144, 154 in cooperation with the ridge 168 of the body 14 hold the fastener 17 in abutment with the barbs 158. The elastic energy of the first and second spring portions 144, 154 also cause the pressing portion 142 to firmly press the heat sink 30 onto the CPU 52. At this stage, the clip is defined to be in a "locked" or tight position.

In disassembly, the operation portion 177 of the fastener 17 is depressed, thereby releasing the second aperture 172 of the fastener 17 from the tab 56 of the socket connector 54. The first aperture 148 of the body 14 is then readily detached from the other tab 56 of the socket connector 54. Thus the heat sink 30 is readily detached from the CPU 52.

It is understood that the invention may be embodied in other forms without departing from the spirit thereof. Thus, the present example and embodiment are to be considered in all respects illustrative and not restrictive, and the invention is not to be limited to the details given herein.

What is claimed is:

1. A heat sink clip comprising:
   a body having a pressing portion and first and second spring portions extending from opposite ends of the pressing portion, a connecting section extending outwardly and upwardly from one free end of the second spring portion and then outwardly and downwardly, thereby forming a ridge; and
   a fastener having an arm and an operation portion extending from the arm, the arm defining an opening for engaging with the connecting section of the body, thereby attaching the fastener to the body, wherein
   the opening of the fastener is firstly positioned around the second spring portion and then moved along the connecting section to be securely locked at an end of the connecting section distant from the second spring portion.

2. The heat sink clip as described in claim 1, wherein a longitudinal slot is defined in the connecting section of the body, to provide elastic deformability for the connecting section.

3. The heat sink clip as described in claim 2, wherein the longitudinal slot is defined in both the connecting section and the second spring portion of the body, to provide elastic deformability for the connecting section.

4. The heat sink clip as described in claim 1, wherein the distal end of the connecting section of the body forms at least a pair of barbs, for engaging with the opening of the fastener.

5. The heat sink clip as described in claim 1, wherein an extension portion extends from a free end of the operation portion of the fastener, for facilitating movement of the operation portion.

6. The heat sink clip as described in claim 1, wherein the second spring portion of the body forms at least a protrusion, for preventing the fastener from moving too far toward the center of the body.

7. A heat sink assembly comprising:
   a socket;
   a CPU positioned on the socket;
   a heat sink positioned on the CPU, said heat sink defining a slot;
   a clip including:
      a body defining a pressing portion received within the slot and confronting the heat sink;
      a fastener attached to around one end of the body, the fastener having engagement means for moveably engaging with the body; and
      means for engaging the fastener with the socket; wherein
      said fastener is moveable relative to the body not only pivotally but also linearly along a longitudinal direction of the body wherein the clip is initially at a loose position in which the clip is loosely engaged with the socket for temporarily holding the CPU on the socket, and successively moved to a locked position in which the clip is tightly engaged with the socket for tightly retaining the CPU on the socket.

8. The assembly as described in claim 7, wherein said means includes a tab on the socket and an aperture in the fastener.

9. The assembly as described in claim 7, further including means for combining the body and the socket together.

10. The assembly as described in claim 7, wherein said body includes means for confining linear movement of the fastener relative to the body.

11. The assembly as described in claim 7, wherein said end of the body is configured to have the clip in a loose status when said fastener is moved in an inner position, but have the clip in a tight status when said fastener is moved to an outer position.

12. A method for assembling a heat sink to a socket, comprising the steps of:
   providing a socket;
   positioning a CPU upon the socket;
   positioning a heat sink on the CPU, said heat sink defining a slot therein;
   providing a clip including a body and a fastener, said body defining a pressing portion adapted to be embedded within the slot, said fastener attached to proximate one end of the body, said fastener being arranged to be both pivotably and linearly moveable relative to the body;
   providing means for combining the fastener and the socket together;
   positioning the clip on the heat sink with initial activation of said means where said clip is in a loose status; and
   linearly moving the fastener to substantiate securement by said means where said clip is in a tight status for efficiently retaining the heat sink in position relative to the socket.

13. The method as described in claim 12, wherein said body and said socket further include means for securement therebetween.

14. The method as described in claim 13, wherein said fastener is linearly moved along a longitudinal direction of the body outwardly.

15. A heat sink clip comprising:
   an elongated body defining a pressing portion first and second spring portion extending oppositely from two opposite ends thereof;
   a first arm extending downwardly from a distal end of the first spring portion; and
   a fastener attached to a distal end of the second spring portion, said fastener including a second arm and an operation portion; wherein
   said fastener is moveable relative to the body not only pivotally but also linearly along a longitudinal direction of the body.

16. The clip as described in claim 15, further including means defining a range for confining linear movement of the fastener relative to the body.

17. The clip as described in claim 16, wherein a portion of the body in said range is higher than other portions thereof.

18. The clip as described in claim 15, wherein both the first and second arms define apertures therein, respectively.

* * * * *